US012588480B2

(12) United States Patent
    Iizumi et al.

(10) Patent No.: US 12,588,480 B2
(45) Date of Patent: Mar. 24, 2026

(54) METHOD OF MANUFACTURING BARRIER-METAL-FREE METAL INTERCONNECT STRUCTURE, AND BARRIER-METAL-FREE METAL INTERCONNECT STRUCTURE

(71) Applicant: EBARA CORPORATION, Tokyo (JP)

(72) Inventors: Takeshi Iizumi, Tokyo (JP); Ryota Koshino, Tokyo (JP); Shinro Ota, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 605 days.

(21) Appl. No.: 17/998,191

(22) PCT Filed: Apr. 26, 2021

(86) PCT No.: PCT/JP2021/016602
     § 371 (c)(1),
     (2) Date: Nov. 8, 2022

(87) PCT Pub. No.: WO2021/230060
     PCT Pub. Date: Nov. 18, 2021

(65) Prior Publication Data
     US 2023/0230878 A1    Jul. 20, 2023

(30) Foreign Application Priority Data
     May 14, 2020    (JP) ................................. 2020-085049

(51) Int. Cl.
     *H01L 21/768* (2006.01)
     *H01L 23/532* (2006.01)

(52) U.S. Cl.
     CPC .... *H01L 21/7684* (2013.01); *H01L 21/76816* (2013.01); *H01L 21/76873* (2013.01); *H01L 21/76877* (2013.01); *H01L 23/53238* (2013.01)

(58) Field of Classification Search
     CPC ........... H01L 21/7684; H01L 21/76816; H01L 21/76873; H01L 21/76877;
     (Continued)

(56) References Cited

U.S. PATENT DOCUMENTS

| 6,387,806 B1 | 5/2002 | Wang et al. |
| 6,433,402 B1 | 8/2002 | Woo et al. |

(Continued)

FOREIGN PATENT DOCUMENTS

| JP | 2007-081113 A | 3/2007 |
| JP | 2008-270545 A | 11/2008 |

(Continued)

OTHER PUBLICATIONS

Japan Patent Office, International Search Report in International Patent Application No. PCT/JP2021/016602, 4 pp. (Jun. 18, 2021).

*Primary Examiner* — Julia Slutsker
(74) *Attorney, Agent, or Firm* — Leydig, Voit & Mayer, Ltd.

(57) ABSTRACT

The present invention relates to a metal interconnect structure containing no barrier metal and a method of manufacturing the metal interconnect structure. The method includes: filling at least a first interconnect trench with an intermetallic compound by depositing the intermetallic compound on an insulating layer having the first interconnect trench and a second interconnect trench formed in the insulating layer, the second interconnect trench being wider than the first interconnect trench; performing a planarization process of polishing the intermetallic compound until the insulating layer is exposed; and then performing a height adjustment process of polishing the intermetallic compound and the insulating layer until a height of the intermetallic compound in the first interconnect trench reaches a predetermined height.

9 Claims, 15 Drawing Sheets

(58) Field of Classification Search
CPC ............. H01L 23/53238; H01L 21/321; H01L
23/53209; H01L 21/3212
See application file for complete search history.

(56) References Cited

U.S. PATENT DOCUMENTS

| | | | | |
|---|---|---|---|---|
| 2007/0059919 A1* | 3/2007 | Ooka | ................ | H01L 21/76831 |
| | | | | 438/618 |
| 2016/0365278 A1 | 12/2016 | Maeshima et al. | | |
| 2018/0122696 A1 | 5/2018 | Shaviv et al. | | |
| 2019/0371733 A1* | 12/2019 | Koike | ............... | H01L 21/76838 |
| 2023/0197510 A1* | 6/2023 | Motoyama | .......... | H01L 21/7684 |
| | | | | 257/750 |

FOREIGN PATENT DOCUMENTS

| | | | |
|---|---|---|---|
| JP | 2010-536175 A | 11/2010 |
| JP | 2012-253121 A | 12/2012 |
| JP | 2019-212892 A | 12/2019 |
| KR | 20140016569 A | 2/2014 |
| KR | 20170017335 A | 2/2017 |
| KR | 20190138276 A | 12/2019 |
| TW | I326903 B | 7/2010 |
| TW | 202011555 A | 3/2020 |
| WO | WO 2009/020755 A2 | 2/2009 |

* cited by examiner

Figure 9:
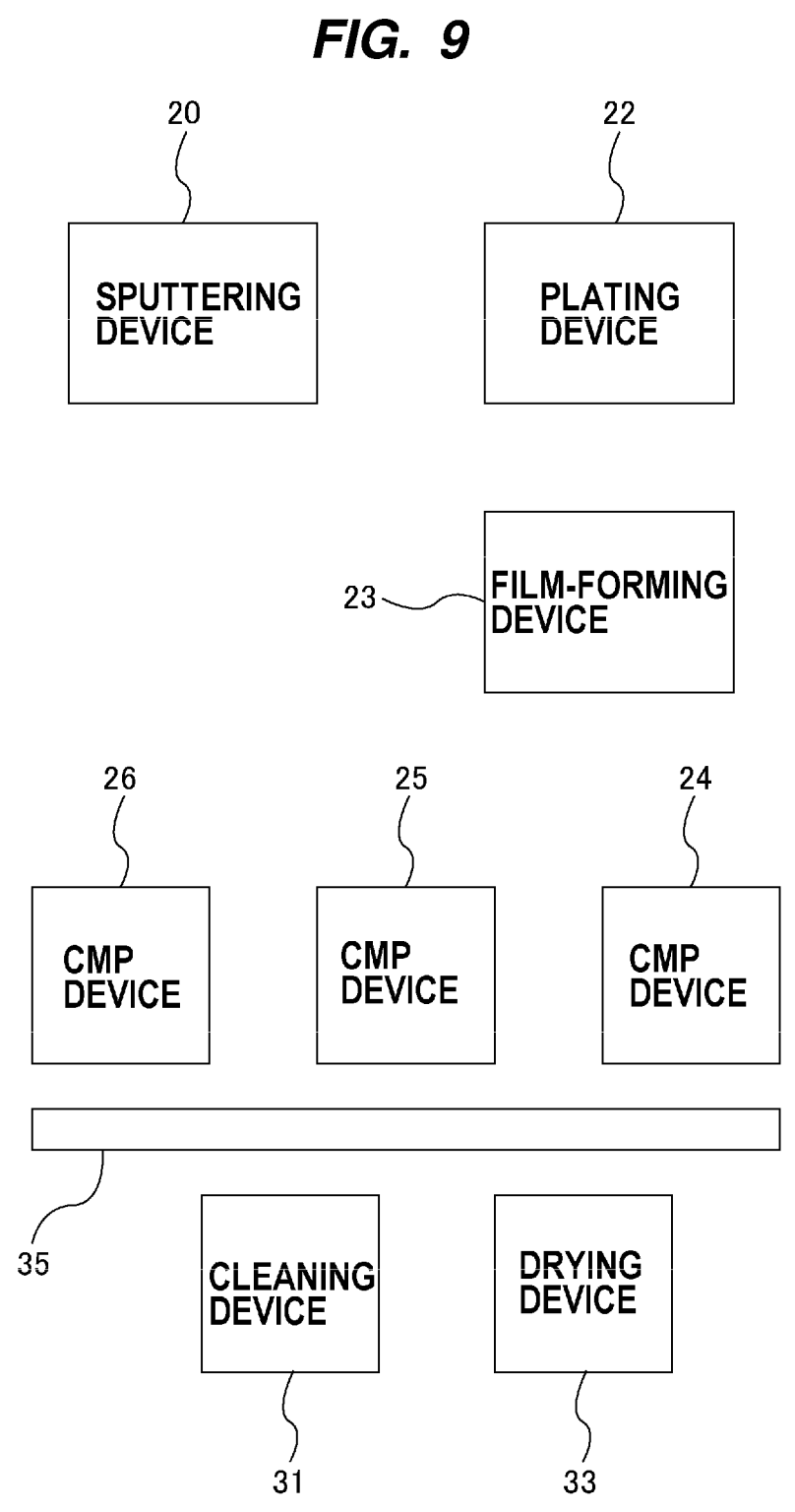

SPUTTERING
DEVICE

22

PLATING
DEVICE

23

FILM-FORMING
DEVICE

26

CMP
DEVICE

25

CMP
DEVICE

24

CMP
DEVICE

35

CLEANING
DEVICE

DRYING
DEVICE

31

33

METHOD OF MANUFACTURING BARRIER-METAL-FREE METAL INTERCONNECT STRUCTURE, AND BARRIER-METAL-FREE METAL INTERCONNECT STRUCTURE

TECHNICAL FIELD

The present invention relates to a metal interconnect structure for a semiconductor device, etc. and a manufacturing method thereof, and more particularly to a metal interconnect structure that does not contain a barrier metal and a manufacturing method of such metal interconnect structure.

BACKGROUND ART

Copper (Cu) is commonly used for an interconnect material. Copper is embedded by plating in interconnect trenches formed in an insulating layer, such as an oxide film, to form copper interconnects. Depositing copper directly onto the insulating layer may cause the copper to diffuse into the insulating layer. Therefore, in order to prevent the diffusion of copper, a barrier metal layer is formed on the insulating layer, and the copper is deposited onto the barrier metal layer.

FIGS. 11A and 11B are cross-sectional views showing an example of a conventional interconnect structure. As shown in FIG. 11A, a barrier metal 205 is deposited on an insulating layer 201 (for example, silicon oxide film) in which interconnect trenches 200 are formed. A seed layer 207 serving as a plating electrode is formed on the barrier metal 205. Copper 208 is then deposited on the seed layer 207 by plating. A part of the copper 208 is embedded in the interconnect trenches 200. Thereafter, excess copper 208 and excess seed layer 207 and part of the insulating layer 201 are removed by CMP (Chemical Mechanical Polishing). As a result, as shown in FIG. 11B, interconnects made of the copper 208 and the seed layer 207 are formed.

FIGS. 12A and 12B are cross-sectional views showing another example of a conventional interconnect structure. As shown in FIG. 12A, a barrier metal 205 is deposited on an insulating layer 201 (for example, silicon oxide film) in which interconnect trenches 200 are formed. A seed layer 207 is deposited on the barrier metal 205, so that the interconnect trenches 200 are filled with the seed layer 207. Further, copper 208 is deposited on the seed layer 207. Thereafter, excess copper 208, excess seed layer 207, and part of insulating layer 201 are removed by CMP (Chemical Mechanical Polishing). As a result, as shown in FIG. 12B, interconnects made of seed layer 207 are formed.

CITATION LIST

Patent Literature

Patent document 1: Japanese laid-open patent publication No. 2010-536175

SUMMARY OF INVENTION

Technical Problem

However, as can be seen from FIGS. 11 and 12, the narrower the interconnect width, the higher a proportion of the barrier metal in the interconnect metal. Since an electrical resistivity of the barrier metal is much higher than that of copper, a resistance of the entire interconnect increases. For this reason, it has been difficult to realize a low-resistance fine interconnect.

Thus, the present invention provides a method of manufacturing a barrier-metal-free metal interconnect structure having a low resistance. The present invention also provides such a barrier-metal-free metal interconnect structure.

Solution to Problem

In an embodiment, there is provided a method of manufacturing a barrier-metal-free metal interconnect structure, comprising: filling at least a first interconnect trench with an intermetallic compound by depositing the intermetallic compound on an insulating layer having the first interconnect trench and a second interconnect trench formed in the insulating layer, the second interconnect trench being wider than the first interconnect trench; performing a planarization process of polishing the intermetallic compound until the insulating layer is exposed; and then performing a height adjustment process of polishing the intermetallic compound and the insulating layer until a height of the intermetallic compound in the first interconnect trench reaches a predetermined height.

In an embodiment, the intermetallic compound is deposited on the insulating layer until the first interconnect trench and the second interconnect trench are filled with the intermetallic compound.

In an embodiment, the planarization process is performed using a first polishing liquid having a removal-rate selectivity that achieves a higher removal rate of the intermetallic compound than a removal rate of the insulating layer, and the height adjustment process is performed using a second polishing liquid having a removal-rate selectivity that achieves a removal rate of the intermetallic compound which is the same as or lower than a removal rate of the insulating layer.

In an embodiment, the method further comprises depositing a second metal on the intermetallic compound to fill the second interconnect trench with the second metal after the first interconnect trench is filled with the intermetallic compound, the second metal being different from the intermetallic compound.

In an embodiment, the planarization process is a process of polishing the second metal and the intermetallic compound until the insulating layer is exposed, and the height adjustment process is a process of polishing the second metal, the intermetallic compound, and the insulating layer until the height of the intermetallic compound in the first interconnect trench reaches the predetermined height.

In an embodiment, the planarization process is performed using a first polishing liquid having a removal-rate selectivity that achieves higher removal rates of the second metal and the intermetallic compound than a removal rate of the insulating layer, and the height adjustment process is performed using a second polishing liquid having a removal-rate selectivity that achieves removal rates of the second metal and the intermetallic compound which are the same as or lower than a removal rate of the insulating layer.

In an embodiment, the planarization process includes: a first planarization process of polishing the second metal until the intermetallic compound is exposed; and a second planarization process of polishing the second metal and the intermetallic compound until the insulating layer is exposed.

In an embodiment, the first planarization process is performed using a first polishing liquid having a removal-rate selectivity that achieves a higher removal rate of the second metal than a removal rate of the intermetallic compound, the second planarization process is performed using a second polishing liquid having a removal-rate selectivity that achieves higher removal rates of the second metal and the intermetallic compound than a removal rate of the insulating layer, and the height adjustment process is performed using a third polishing liquid having a removal-rate selectivity that achieves removal rates of the second metal and the intermetallic compound which are the same as or lower than a removal rate of the insulating layer.

In an embodiment, the method further comprises: forming a seed layer on the intermetallic compound after the first interconnect trench is filled with the intermetallic compound; and depositing a second metal on the seed layer to fill the second interconnect trench with the second metal, the second metal being different from the intermetallic compound.

In an embodiment, the planarization process is a process of polishing the second metal, the seed layer, and the intermetallic compound until the insulating layer is exposed, and the height adjustment process is a process of polishing the second metal, the seed layer, the intermetallic compound, and the insulating layer until the height of the intermetallic compound in the first interconnect trench reaches the predetermined height.

In an embodiment, the planarization process is performed using a first polishing liquid having a removal-rate selectivity that achieves higher removal rates of the second metal, the seed layer, and the intermetallic compound than a removal rate of the insulating layer, and the height adjustment process is performed using a second polishing liquid having a removal-rate selectivity that achieves removal rates of the second metal, the seed layer, and the intermetallic compound which are the same as or lower than a removal rate of the insulating layer.

In an embodiment, the planarization process includes: a first planarization process of polishing the second metal and the seed layer until the intermetallic compound is exposed; and a second planarization process of polishing the second metal, the seed layer, and the intermetallic compound until the insulating layer is exposed.

In an embodiment, the first planarization process is performed using a first polishing liquid having a removal-rate selectivity that achieves higher removal rates of the second metal and the seed layer than a removal rate of the intermetallic compound, the second planarization process is performed using a second polishing liquid having a removal-rate selectivity that achieves higher removal rates of the second metal, the seed layer, and the intermetallic compound than a removal rate of the insulating layer, and the height adjustment process is performed using a third polishing liquid having a removal-rate selectivity that achieves removal rates of the second metal, the seed layer, and the intermetallic compound which are the same as or lower than a removal rate of the insulating layer.

In an embodiment, the intermetallic compound is $CuAl_2$ or NiAl.

In an embodiment, there is provided a barrier-metal-free metal interconnect structure comprising: an insulating layer having a first interconnect trench and a second interconnect trench formed therein, the second interconnect trench being wider than the first interconnect trench; and an intermetallic compound filling the first interconnect trench.

In an embodiment, the barrier-metal-free metal interconnect structure further comprises an intermetallic compound filling the second interconnect trench.

In an embodiment, the barrier-metal-free metal interconnect structure further comprises an intermetallic compound and a second metal filling the second interconnect trench.

In an embodiment, the second metal is copper, titanium, or titanium nitride.

In an embodiment, the first interconnect trench has a width smaller than 7 nm.

In an embodiment, the intermetallic compound filling the first interconnect trench is $CuAl_2$ or NiAl.

Advantageous Effects of Invention

According to the present invention, the narrow first interconnect trench is filled with the intermetallic compound and no barrier metal exists in the first interconnect trench. Therefore, a low-resistance interconnect made of the intermetallic compound in the first interconnect trench can be realized.

BRIEF DESCRIPTION OF DRAWINGS

FIG. 9 is a schematic diagram showing a manufacturing system for manufacturing a barrier-metal-free metal interconnect structure.

DESCRIPTION OF EMBODIMENTS

Hereinafter, embodiments of the present invention will be described with reference to the drawings.

Figure 1A:
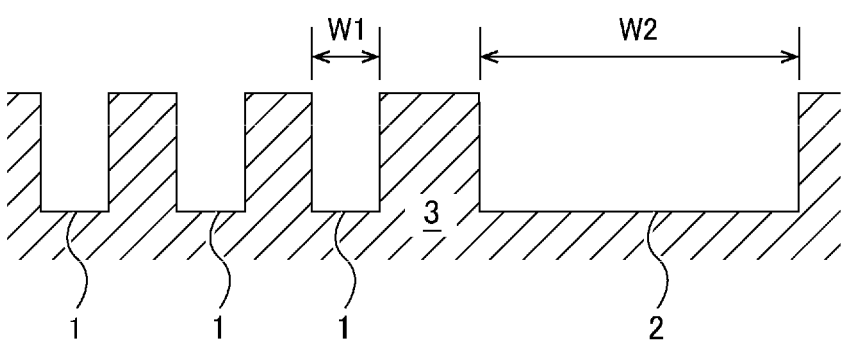
FIG. 1A is a diagram illustrating an embodiment of a method of manufacturing a barrier-metal-free metal interconnect structure.

FIGS. 1A to 1D are diagrams illustrating an embodiment of a method of manufacturing a barrier-metal-free metal interconnect structure. As shown in FIG. 1A, an insulating layer 3 in which first interconnect trenches 1 and a second interconnect trench 2 are formed is prepared. The insulating layer 3 is formed on a workpiece, such as a wafer, a substrate, a panel, or the like. A material forming the insulating layer 3 is, for example, silicon dioxide ($SiO_2$), and the insulating layer 3 is, for example, a silicon oxide film. A width W1 of each first interconnect trench 1 is narrower than a width W2 of the second interconnect trench 2. In one embodiment, the width W1 of each first interconnect trench 1 is smaller than 7 nm.

Figure 1B:
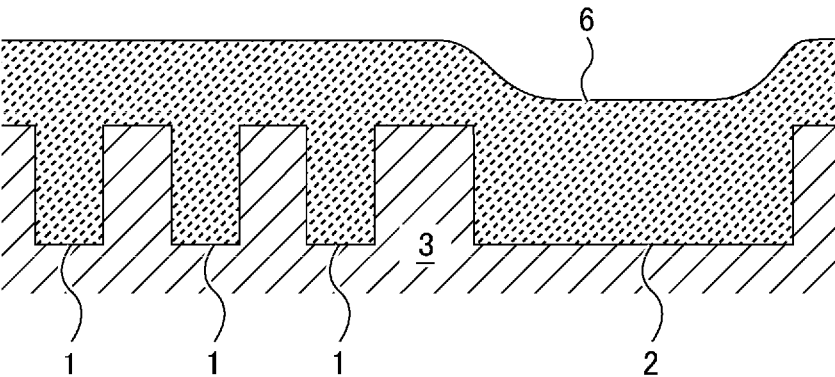
FIG. 1B is a diagram illustrating an embodiment of the method of manufacturing the barrier-metal-free metal interconnect structure.

As shown in FIG. 1B, an intermetallic compound 6 is deposited on the insulating layer 3. The entireties of the first interconnect trenches 1 and the second interconnect trench 2 are filled with the intermetallic compound 6. A method of depositing the intermetallic compound 6 used in this embodiment is sputtering, but is not particularly limited. Specific examples of the intermetallic compound 6 include $CuAl_2$ and NiAl. For example, one embodiment of a method of forming $CuAl_2$ by sputtering involves applying a voltage between a workpiece and a target made of copper (Cu) and aluminum (Al) while providing flow of inert gas (typically argon gas) to thereby deposit $CuAl_2$ on the insulating layer 3.

Figure 1C:
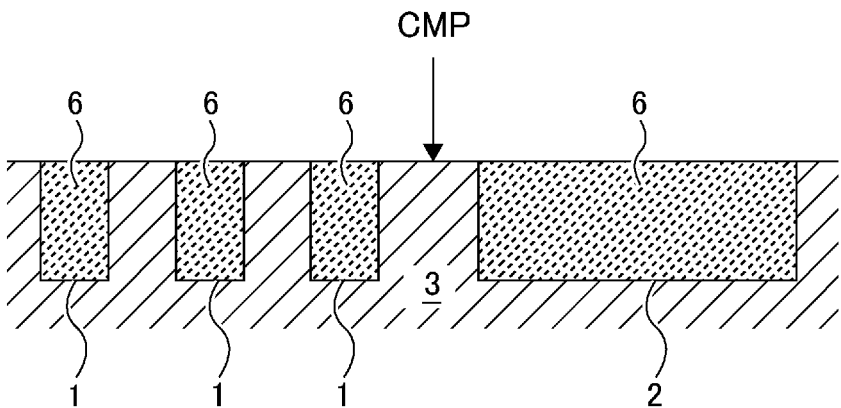
FIG. 1C is a diagram illustrating an embodiment of the method of manufacturing the barrier-metal-free metal interconnect structure.

As shown in FIG. 1C, a planarization process of polishing the intermetallic compound 6 is performed until the insulating layer 3 is exposed. This planarization process is a CMP (chemical mechanical polishing) process and is performed by a CMP device. More specifically, the intermetallic compound 6 is placed in sliding contact with a first polishing pad (not shown) while a first polishing liquid is supplied onto the first polishing pad. The intermetallic compound 6 is planarized by a chemical action of the first polishing liquid and a mechanical action of abrasive grains contained in the first polishing liquid and/or the first polishing pad.

The first polishing liquid has a removal-rate selectivity that achieves a higher removal rate of the intermetallic compound 6 than a removal rate of the insulating layer 3. The removal rate is a rate of thickness of a material removed per unit time. When the first polishing liquid having such removal-rate selectivity is used, the exposed surface of the insulating layer 3 functions as a polishing stopper. Therefore, polishing of the intermetallic compound 6 can be substantially stopped when the insulating layer 3 is exposed. The planarization process may be performed while the thickness of the intermetallic compound 6 is measured with a film-thickness sensor. Based on the measured thickness of the intermetallic compound 6, a point in time at which the insulating layer 3 is exposed can be estimated. Although the configuration of the film-thickness sensor is not particularly limited, for example, an eddy current sensor can be used as the film-thickness sensor.

Figure 1D:
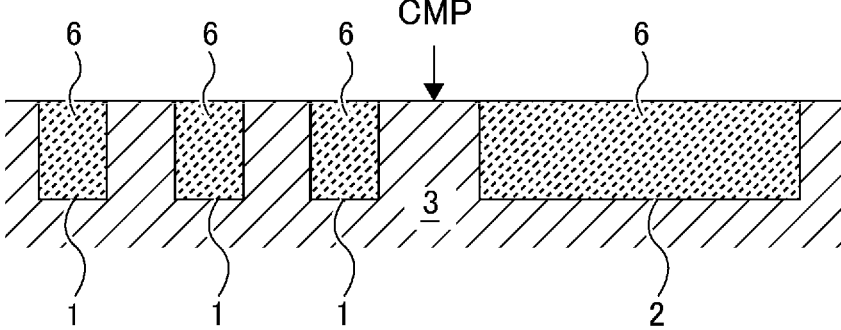
FIG. 1D is a diagram illustrating one embodiment of the method of manufacturing the barrier-metal-free metal interconnect structure.

As shown in FIG. 1D, after the planarization process, a height adjustment process is performed. This height adjustment process is a process of polishing the intermetallic compound 6 and the insulating layer 3 until a height of the intermetallic compound 6 in the first interconnect trenches 1 reaches a predetermined height. The height adjustment process is also a CMP (chemical mechanical polishing) process and is performed by a CMP device. More specifically, the intermetallic compound 6 and the insulating layer 3 are placed in sliding contact with a second polishing pad (not shown) while a second polishing liquid is supplied onto the second polishing pad. The intermetallic compound 6 and the insulating layer 3 are polished by a chemical action of the second polishing liquid and a mechanical action of abrasive grains contained in the second polishing liquid and/or the second polishing pad.

The height adjustment process is performed using the second polishing liquid having a removal-rate selectivity that achieves a removal rate of the intermetallic compound 6 which is the same as or lower than a removal rate of the insulating layer 3. Specifically, if dishing is expected to occur when the intermetallic compound 6 in the second interconnect trench 2 is polished, the second polishing liquid having a lower removal-rate selectivity that achieves a removal rate of the intermetallic compound 6 lower than a removal rate of the insulating layer 3 is used. On the other hand, if dishing is not expected to occur when the intermetallic compound 6 in the second interconnect trench 2 is polished, the second polishing liquid having a removal-rate selectivity that achieves a removal rate of the intermetallic compound 6 which is the same as a removal rate of the insulating layer 3 is used.

The height adjustment process is performed while a height of the intermetallic compound 6 in the first interconnect trenches 1 (i.e., an interconnect height) is measured by the film-thickness sensor. When the height of the intermetallic compound 6 in the first interconnect trenches 1 measured by the film-thickness sensor reaches a predetermined height, the height adjustment process is stopped. In this way, a barrier-metal-free metal interconnect structure is produced.

As shown in FIG. 1D, the barrier-metal-free metal interconnect structure manufactured according to the method described above includes the insulating layer 3 in which the first interconnect trenches 1 and the second interconnect trench 2 are formed, and the intermetallic compound 6 filling the first interconnect trenches 1 and the interconnect trench 2. The narrow first interconnect trenches 1 are filled with the intermetallic compound 6 and no barrier metal exists in the first interconnect trenches 1. Therefore, low-resistance interconnects made of the intermetallic compound 6 in the first interconnect trenches 1 can be realized.

Figure 2:
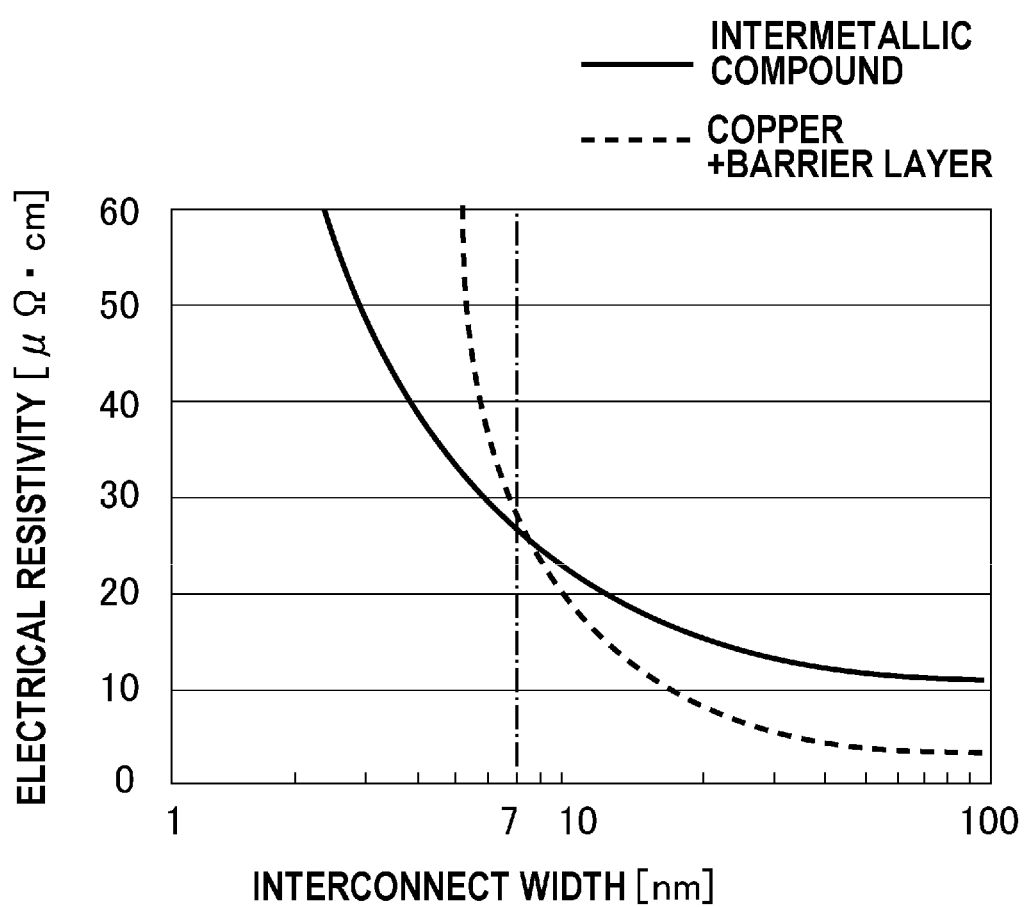
FIG. 2 is a graph showing a relationship between electrical resistivity and interconnect width.

The intermetallic compound 6 used in this embodiment is $CuAl_2$. FIG. 2 is a graph showing a relationship between electrical resistivity and interconnect width. As shown in FIG. 2, when the interconnect width is small to some extent, the electrical resistivity of the intermetallic compound 6 is smaller than an electrical resistivity of a combination of copper and a barrier metal layer which are conventional interconnect materials. In the graph shown in FIG. 2, when the interconnect width is smaller than 7 nm, the electrical resistivity of the intermetallic compound 6 made of $CuAl_2$ is smaller than the electrical resistivity of the combination of the copper and the barrier metal layer. Therefore, when the width of each of the first interconnect trenches 1 is smaller than 7 nm, the interconnect made of the intermetallic compound 6 exhibits a lower electrical efficiency than that of the conventional interconnect made of the copper and the barrier metal layer. From this point of view, the width of each of the first interconnect trenches 1 in this embodiment is less than 7 nm.

On the other hand, the width of the second interconnect trench 2 is 7 nm or more. In one embodiment, the second interconnect trench 2 may have a width of 0.1 μm or more, or may have a width of 1 μm or more. According to the graph shown in FIG. 2, when the interconnect width is 7 nm or more, the electrical resistivity of $CuAl_2$ is higher than the electrical resistivity of the combination of the copper and the barrier metal layer. However, since a cross section of the interconnect is large, an electrical resistance is small. Therefore, the interconnect in the second interconnect trench 2 can also have a low resistance, as well as the interconnects in the first interconnect trenches 1.

FIGS. 3A to 3E are diagrams illustrating another embodiment of a method of fabricating a barrier-metal-free metal interconnect structure. Configurations and processes of this embodiment, which will not be particularly described, are the same as those of the embodiments described with reference to FIGS. 1A to 1D, and repetitive descriptions will be omitted.

Figure 3A:
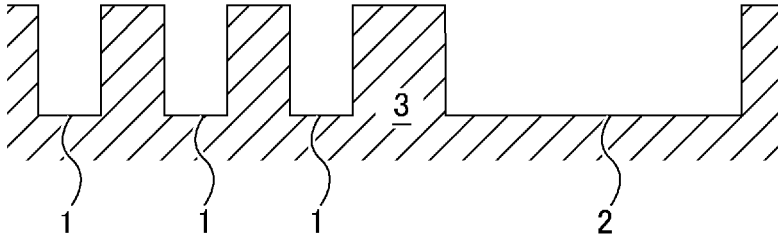
FIG. 3A is a diagram illustrating another embodiment of a method of manufacturing a barrier-metal-free metal interconnect structure.
Figure 3B:
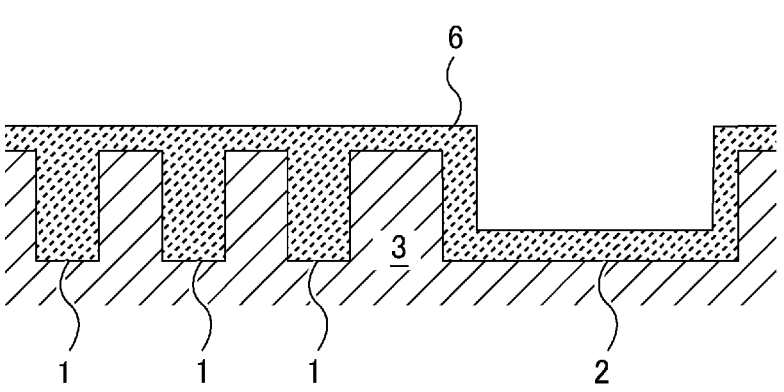
FIG. 3B is a diagram illustrating another embodiment of the method of manufacturing the barrier-metal-free metal interconnect structure.

As shown in FIG. 3A, an insulating layer 3 in which first interconnect trenches 1 and a second interconnect trench 2 are formed is prepared. An intermetallic compound 6 is then deposited on the insulating layer 3, as shown in FIG. 3B. The entire first interconnect trenches 1 are filled with the intermetallic compound 6, and a film of the intermetallic compound 6 is formed in the second interconnect trench 2. The surface of the insulating layer 3 forming the second interconnect trench 2 is covered with the intermetallic compound 6, but the entire second interconnect trench 2 is not filled with the intermetallic compound 6.

Figure 3C:
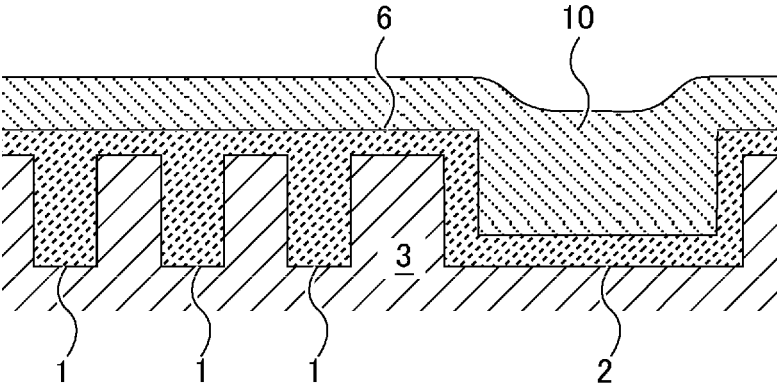
FIG. 3C is a diagram illustrating another embodiment of the method of manufacturing the barrier-metal-free metal interconnect structure.

After filling of the first interconnect trenches 1 with the intermetallic compound 6, as shown in FIG. 3C, a second metal 10 different from the intermetallic compound 6 is deposited on the intermetallic compound 6, until the second interconnect trench 2 is filled with the second metal 10. Examples of the second metal 10 include copper, titanium, titanium nitride, etc. Although a method of depositing the second metal 10 is not particularly limited, electroplating, for example, can be used.

Figure 3D:
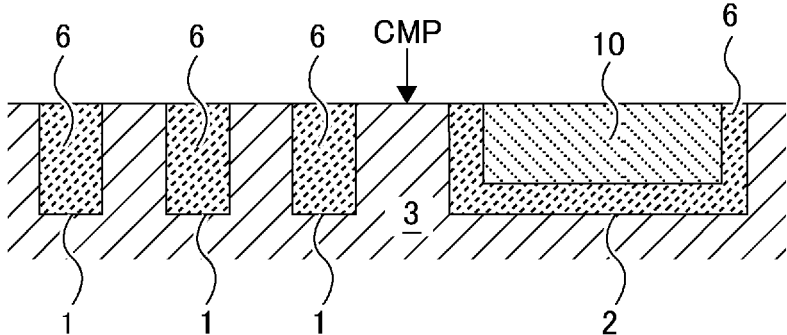
FIG. 3D is a diagram illustrating another embodiment of the method of manufacturing the barrier-metal-free metal interconnect structure.

As shown in FIG. 3D, a planarization process of polishing the second metal 10 and the intermetallic compound 6 is performed until the insulating layer 3 is exposed. This planarization process is a CMP (chemical mechanical polishing) process and is performed by a CMP device. More specifically, while a first polishing liquid is supplied onto a first polishing pad, the second metal 10 and the intermetallic compound 6 are placed in sliding contact with the first polishing pad. The second metal 10 and the intermetallic compound 6 are planarized by a chemical action of the first polishing liquid and a mechanical action of abrasive grains contained in the first polishing liquid and/or the first polishing pad. The first polishing liquid has a removal-rate selectivity that achieves higher removal rates of the second metal 10 and the intermetallic compound 6 than a removal rate of the insulating layer 3.

Figure 3E:
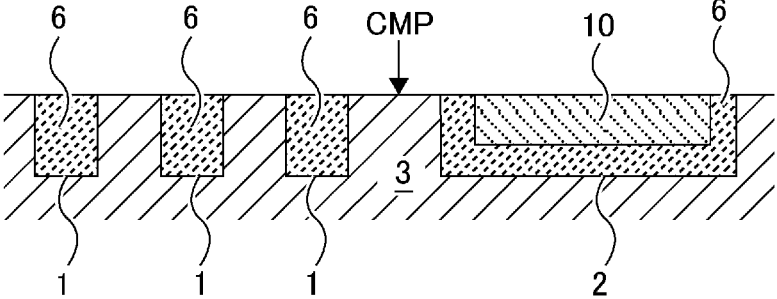
FIG. 3E is a diagram illustrating another embodiment of the method of manufacturing the barrier-metal-free metal interconnect structure.

As shown in FIG. 3E, after the planarization process, a height adjustment process is performed. This height adjustment process is a process of polishing the second metal 10, the intermetallic compound 6, and the insulating layer 3 until a height of the intermetallic compound 6 in the first interconnect trenches 1 reaches a predetermined height. This height adjustment process is also a CMP (chemical mechanical polishing) process and is performed by a CMP device. More specifically, while a second polishing liquid is supplied onto a second polishing pad, the second metal 10, the intermetallic compound 6, and the insulating layer 3 are placed in sliding contact with the second polishing pad. The second metal 10, the intermetallic compound 6, and the insulating layer 3 are polished by a chemical action of the second polishing liquid and a mechanical action of abrasive grains contained in the second polishing liquid and/or the second polishing pad.

The height adjustment process is performed using the second polishing liquid having a removal-rate selectivity that achieves removal rates of the second metal 10 and the intermetallic compound 6 which are the same as or lower than a removal rate of the insulating layer 3. Specifically, if dishing is expected to occur when the second metal 10 and the intermetallic compound 6 in the second interconnect trench 2 are polished, the second polishing liquid having a removal-rate selectivity that achieves removal rates of the second metal 10 and the intermetallic compound 6 which are lower than a removal rate of the insulating layer 3 is used.

On the other hand, if dishing is not expected to occur when the second metal 10 and the intermetallic compound 6 in the second interconnect trench 2 are polished, the second polishing liquid having a removal-rate selectivity that achieves removal rates of the second metal 10 and the intermetallic compound 6 which are the same as a removal rate of the insulating layer 3 is used.

The height adjustment process is performed while a height of the intermetallic compound 6 in the first interconnect trenches 1 (i.e., an interconnect height) is measured by the film-thickness sensor. When the height of the intermetallic compound 6 in the first interconnect trenches 1 measured by the film-thickness sensor reaches a predetermined height, the height adjustment process is stopped. In this way, a barrier-metal-free metal interconnect structure is produced. The narrow first interconnect trenches 1 are filled with the intermetallic compound 6 and no barrier metal exists in the first interconnect trenches 1. Therefore, a low-resistance interconnect made of the intermetallic compound 6 in the first interconnect trenches 1 can be realized. The second interconnect trench 2 is filled with the intermetallic compound 6 and the second metal 10, both of which form a wide interconnect.

FIGS. 4A to 4F are diagrams illustrating yet another embodiment of a method of fabricating a barrier-metal-free metal interconnect structure. Configurations and processes of this embodiment, which will not be particularly described, are the same as those of the embodiments described with reference to FIGS. 3A to 3E, and repetitive descriptions will be omitted.

Figure 4A:
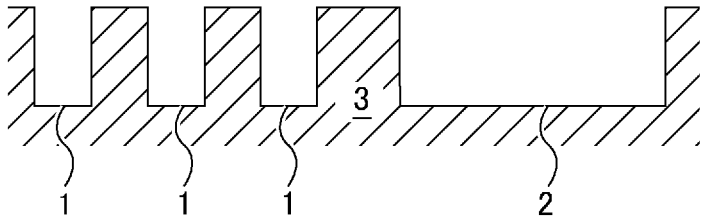
FIG. 4A is a diagram illustrating still another embodiment of a method of manufacturing a barrier-metal-free metal interconnect structure.
Figure 4B:
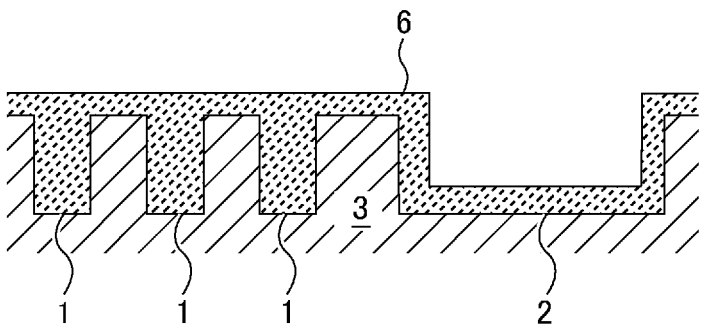
FIG. 4B is a diagram illustrating still another embodiment of the method of manufacturing the barrier-metal-free metal interconnect structure.
Figure 4C:
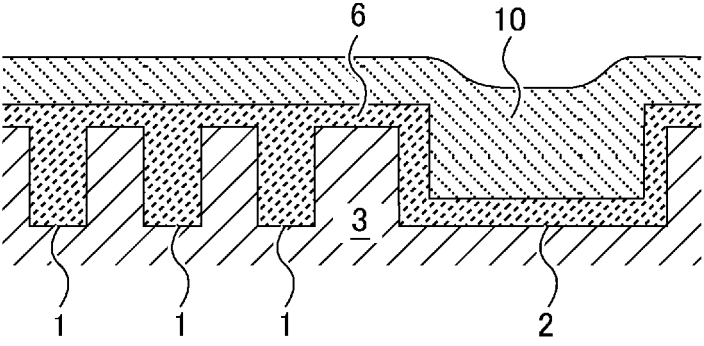
FIG. 4C is a diagram illustrating still another embodiment of the method of manufacturing the barrier-metal-free metal interconnect structure.
Figure 4D:
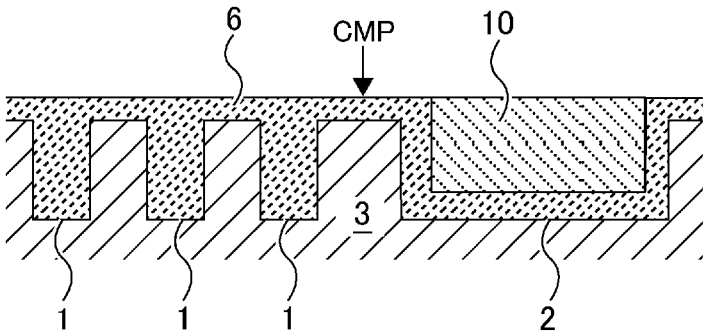
FIG. 4D is a diagram illustrating still another embodiment of the method of manufacturing the barrier-metal-free metal interconnect structure.

Processes shown in FIGS. 4A to 4C are the same as the processes shown in FIGS. 3A to 3C. As shown in FIG. 4D, a first planarization process of polishing the second metal 10 is performed until the intermetallic compound 6 is exposed. More specifically, the second metal 10 is placed in sliding contact with a first polishing pad while a first polishing liquid is supplied onto the first polishing pad. The second metal 10 is planarized by a chemical action of the first polishing liquid and a mechanical action of abrasive grains contained in the first polishing liquid and/or the first polishing pad. The first polishing liquid has a removal-rate selectivity that achieves a higher removal rate of the second metal 10 than a removal rate of the intermetallic compound 6. Therefore, the intermetallic compound 6 functions as a polishing stopper.

Figure 4E:
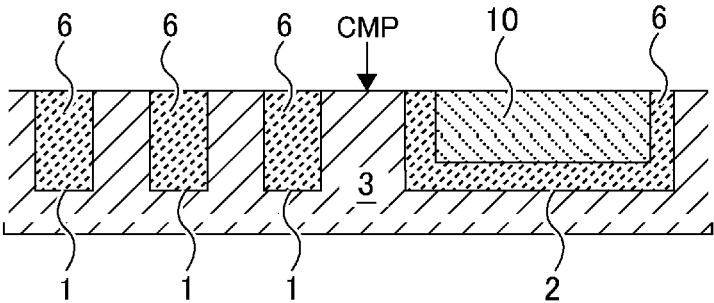
FIG. 4E is a diagram illustrating still another embodiment of the method of manufacturing the barrier-metal-free metal interconnect structure.

After the first planarization process, a second planarization process is performed, as shown in FIG. 4E. This second planarization process is a process of polishing the second metal 10 and the intermetallic compound 6 until the insulating layer 3 is exposed. More specifically, while a second polishing liquid is supplied onto a second polishing pad, the second metal 10 and the intermetallic compound 6 are placed in sliding contact with the second polishing pad. The second metal 10 and the intermetallic compound 6 are planarized by a chemical action of the second polishing liquid and a mechanical action of abrasive grains contained in the second polishing liquid and/or the second polishing pad. The second polishing liquid has a removal-rate selectivity that achieves higher removal rates of the second metal 10 and the intermetallic compound 6 than a removal rate of the insulating layer 3. Therefore, the insulating layer 3 functions as a polishing stopper.

Figure 4F:
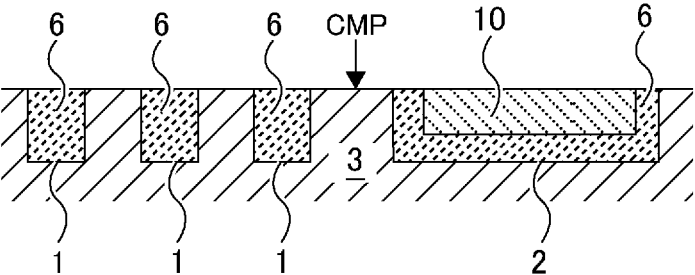
FIG. 4F is a diagram illustrating still another embodiment of the method of manufacturing the barrier-metal-free metal interconnect structure.

As shown in FIG. 4F, after the second planarization process, a height adjustment process is performed. This height adjustment process is a process of polishing the second metal 10, the intermetallic compound 6, and the insulating layer 3 until a height of the intermetallic compound 6 in the first interconnect trenches 1 reaches a predetermined height. More specifically, the second metal 10, the intermetallic compound 6, and the insulating layer 3 are placed in sliding contact with a third polishing pad while a third polishing liquid is supplied onto the third polishing pad. The second metal 10, the intermetallic compound 6, and the insulating layer 3 are polished by a chemical action of the third polishing liquid and a mechanical action of abrasive grains contained in the third polishing liquid and/or the third polishing pad.

The height adjustment process is performed using the third polishing liquid having a removal-rate selectivity that achieves removal rates of the second metal 10 and the intermetallic compound 6 which are the same as or lower than a removal rate of the insulating layer 3. Specifically, if dishing is expected to occur when the second metal 10 and the intermetallic compound 6 in the second interconnect trench 2 are polished, the third polishing liquid having a removal-rate selectivity that achieves removal rates of the second metal 10 and the intermetallic compound 6 which are lower than a removal rate of the insulating layer 3 is used. On the other hand, if dishing is not expected to occur when the second metal 10 and the intermetallic compound 6 in the second interconnect trench 2 are polished, the third polishing liquid having a removal-rate selectivity that achieves removal rates of the second metal 10 and the intermetallic compound 6 which are the same as a removal rate of the insulating layer 3 is used.

FIGS. 5A to 5D, and FIGS. 6A and 6B are diagrams illustrating yet another embodiment of a method of fabricating a barrier-metal-free metal interconnect structure. Configurations and processes of this embodiment, which will not be particularly described, are the same as those of the embodiments described with reference to FIGS. 1A to 1D, and repetitive descriptions will be omitted.

Figure 5A:
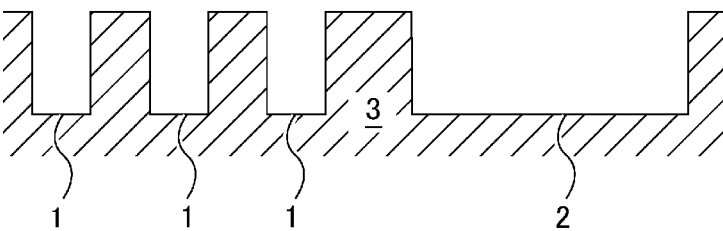
FIG. 5A is a diagram illustrating still another embodiment of a method of manufacturing a barrier-metal-free metal interconnect structure.
Figure 5B:
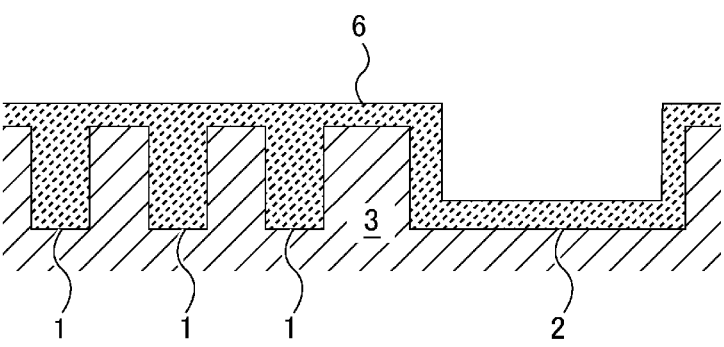
FIG. 5B is a diagram illustrating still another embodiment of the method of manufacturing the barrier-metal-free metal interconnect structure.

As shown in FIG. 5A, an insulating layer 3 in which first interconnect trenches 1 and a second interconnect trench 2 are formed is prepared. An intermetallic compound 6 is then deposited on the insulating layer 3, as shown in FIG. 5B. The entire first interconnect trenches 1 are filled with the intermetallic compound 6, and a film of the intermetallic compound 6 is formed in the second interconnect trench 2. The surface of the insulating layer 3 forming the second interconnect trench 2 is covered with the intermetallic compound 6, but the entire second interconnect trench 2 is not filled with the intermetallic compound 6.

Figure 5C:
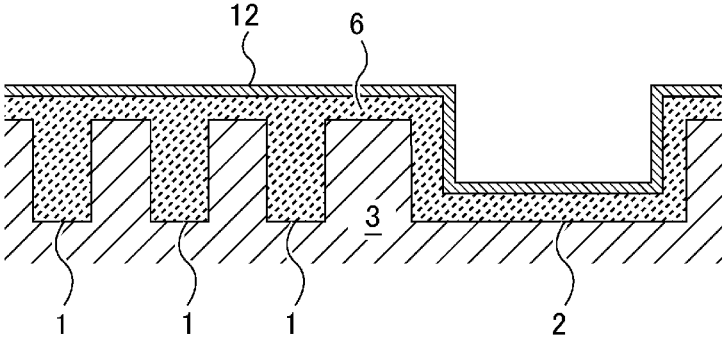
FIG. 5C is a diagram illustrating still another embodiment of the method of manufacturing the barrier-metal-free metal interconnect structure.

After filling of the first interconnect trenches 1 with the intermetallic compound 6, as shown in FIG. 5C, a seed layer 12 is formed on the intermetallic compound 6. The seed layer 12 functions as an electrode for subsequent electroplating. The seed layer 12 is made of copper, for example. The seed layer 12 can be formed by electroless plating, sputtering, or the like.

Figure 5D:
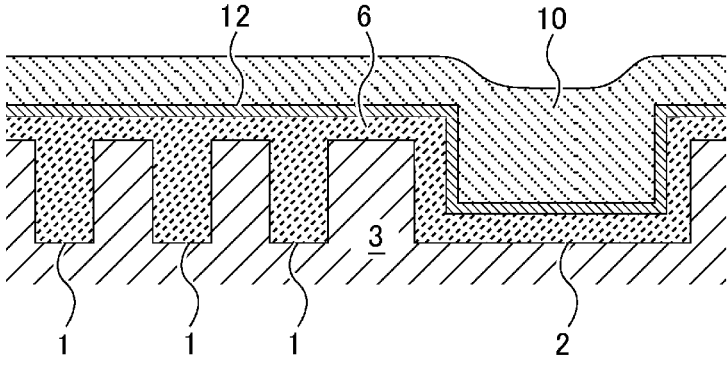
FIG. 5D is a diagram illustrating still another embodiment of the method of manufacturing the barrier-metal-free metal interconnect structure.

As shown in FIG. 5D, a second metal 10 different from the intermetallic compound 6 is deposited on the seed layer 12, so that the second interconnect trench 2 is filled with the second metal 10. Examples of the second metal 10 include copper, titanium, titanium nitride, and the like. In this embodiment, copper is used as the second metal 10, and electroplating is used as a method of depositing the second metal 10.

Figure 6A:
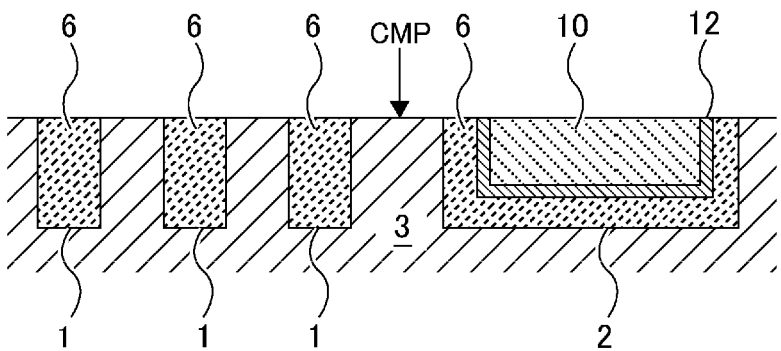
FIG. 6A is a diagram further illustrating the embodiment shown in FIGS. 5A to 5D.

As shown in FIG. 6A, a planarization process of polishing the second metal 10, the seed layer 12, and the intermetallic compound 6 is performed until the insulating layer 3 is exposed. This planarization process is a CMP (chemical mechanical polishing) process and is performed by a CMP device. More specifically, the second metal 10, the seed layer 12, and the intermetallic compound 6 are placed in sliding contact with a first polishing pad while a first polishing liquid is supplied onto the first polishing pad. The second metal 10, the seed layer 12, and the intermetallic compound 6 are planarized by a chemical action of the first polishing liquid and a mechanical action of abrasive grains contained in the first polishing liquid and/or the first polishing pad. The first polishing liquid has a removal-rate selectivity that achieve higher removal rates of the second metal 10, the seed layer 12, and the intermetallic compound 6 than a removal rate of the insulating layer 3. Therefore, the insulating layer 3 functions as a polishing stopper.

Figure 6B:
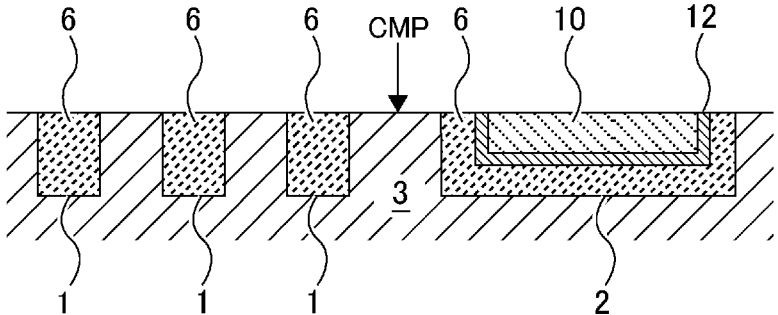
FIG. 6B is a diagram further illustrating the embodiment shown in FIGS. 5A to 5D.
Figure 7A:
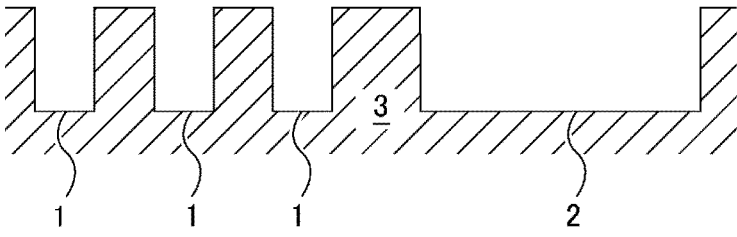
FIG. 7A is a diagram illustrating still another embodiment of a method of manufacturing a barrier-metal-free metal interconnect structure.
Figure 7B:
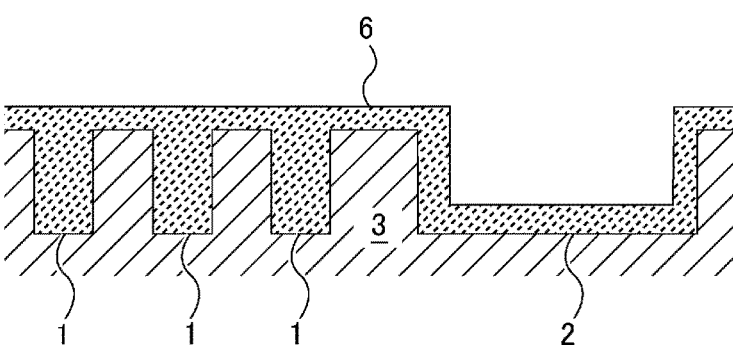
FIG. 7B is a diagram illustrating still another embodiment of the method of manufacturing the barrier-metal-free metal interconnect structure.
Figure 7C:
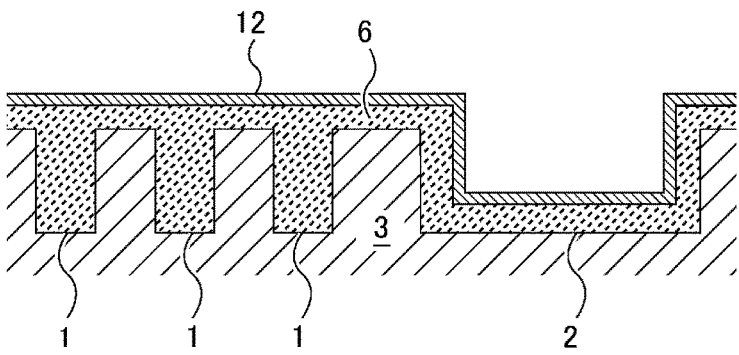
FIG. 7C is a diagram illustrating still another embodiment of the method of manufacturing the barrier-metal-free metal interconnect structure.
Figure 7D:
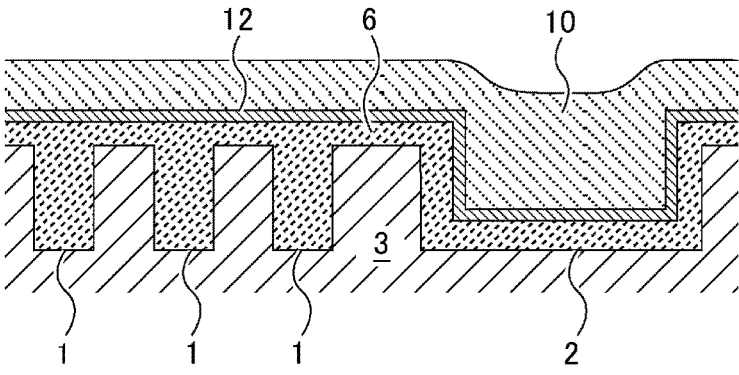
FIG. 7D is a diagram illustrating still another embodiment of the method of manufacturing the barrier-metal-free metal interconnect structure.

As shown in FIG. 6B, after the planarization process, a height adjustment process is performed. This height adjustment process is a process of polishing the second metal 10, the seed layer 12, the intermetallic compound 6, and the insulating layer 3 until a height of the intermetallic compound 6 in the first interconnect trenches 1 reaches a predetermined height. This height adjustment process is also a CMP (chemical mechanical polishing) process and is performed by a CMP device. More specifically, the second metal 10, the seed layer 12, the intermetallic compound 6, and the insulating layer 3 are placed in sliding contact with a second polishing pad while a second polishing liquid is supplied onto the second polishing pad. The second metal 10, the seed layer 12, the intermetallic compound 6, and the insulating layer 3 are polished by a chemical action of the second polishing liquid and a mechanical action of abrasive grains contained in the second polishing liquid and/or the second polishing pad.

The height adjustment process is performed using the second polishing liquid having a removal-rate selectivity that achieves removal rates of the second metal 10, the seed layer 12, and the intermetallic compound 6 which are the same as or lower than a removal rate of the insulating layer 3. Specifically, if dishing is expected to occur when the second metal 10, the seed layer 12, and the intermetallic compound 6 in the second interconnect trench 2 are polished, the second polishing liquid having a removal-rate selectivity that achieves removal rates of the second metal 10, the seed layer 12, and the intermetallic compound 6 which are lower than a removal rate of the insulating layer 3 is used. On the other hand, if it is expected that dishing will not occur when the second metal 10, the seed layer 12, and the intermetallic compound 6 in the second interconnect trench 2 are polished, the second polishing liquid having a removal-rate selectivity that achieves removal rates of the second metal 10, the seed layer 12, and the intermetallic compound 6 which are the same as a removal rate of the insulating layer 3 is used.

The height adjustment process is performed while a height of the intermetallic compound 6 in the first interconnect trenches 1 (i.e., an interconnect height) is measured by the film-thickness sensor. When the height of the intermetallic compound 6 in the first interconnect trenches 1 measured by the film-thickness sensor reaches a predetermined height, the height adjustment process is stopped. In this way, a barrier-metal-free metal interconnect structure is produced. The narrow first interconnect trenches 1 are filled with the intermetallic compound 6 and no barrier metal exists in the first interconnect trenches 1. Therefore, low-resistance interconnects made of the intermetallic compound 6 in the first interconnect trenches 1 can be realized. The second interconnect trench 2 is filled with the intermetallic compound 6, the second metal 10, and the seed layer 12, all of which form a wide interconnect.

FIGS. 7A to 7D and FIGS. 8A to 8C are diagrams illustrating yet another embodiment of a method of fabricating a barrier-metal-free metal interconnect structure. Configurations and processes of this embodiment, which will not be particularly described, are the same as those of the embodiments described with reference to FIGS. 5A to 5D and FIGS. 6A and 6B, and repetitive descriptions will be omitted.

Figure 8A:
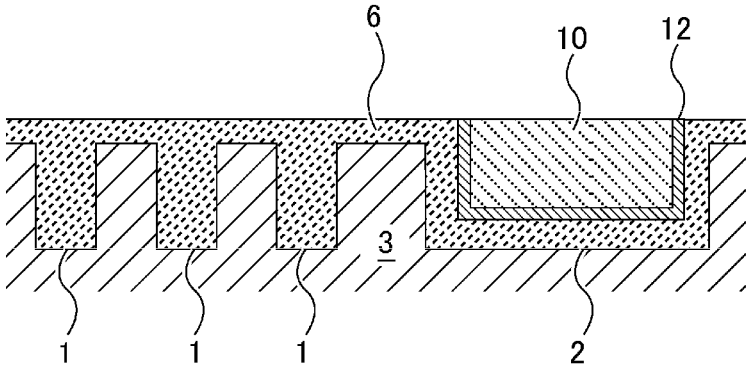
FIG. 8A is a diagram further illustrating the embodiment shown in FIGS. 7A to 7D.

FIGS. 7A to 7D are performed in the same manner as FIGS. 5A to 5D. As shown in FIG. 8A, a first planarization process of polishing the second metal 10 and the seed layer 12 is performed until the intermetallic compound 6 is exposed. More specifically, the second metal 10 and the seed layer 12 are placed in sliding contact with a first polishing pad while a first polishing liquid is supplied onto the first polishing pad. The second metal 10 and the seed layer 12 are planarized by a chemical action of the first polishing liquid and a mechanical action of abrasive grains contained in the first polishing liquid and/or the first polishing pad. The first polishing liquid has a removal-rate selectivity that achieves higher removal rates of the second metal 10 and the seed layer 12 than a removal rate of the intermetallic compound 6. Therefore, the intermetallic compound 6 functions as a polishing stopper.

Figure 8B:
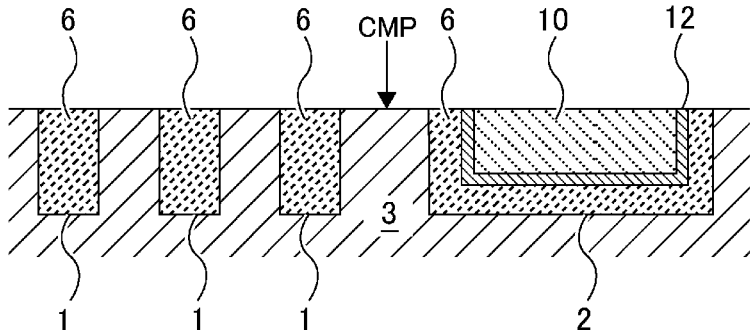
FIG. 8B is a diagram further illustrating the embodiment shown in FIGS. 7A to 7D.

After the first planarization process, a second planarization process is performed, as shown in FIG. 8B. This second planarization process is a process of polishing the second metal 10, the seed layer 12, and the intermetallic compound 6 until the insulating layer 3 is exposed. More specifically, while a second polishing liquid is supplied onto a second polishing pad, the second metal 10, the seed layer 12, and the intermetallic compound 6 are placed in sliding contact with the second polishing pad. The second metal 10, the seed layer 12, and the intermetallic compound 6 are planarized by a chemical action of the second polishing liquid and a mechanical action of abrasive grains contained in the second polishing liquid and/or the second polishing pad. The second polishing liquid has a removal-rate selectivity that achieves higher removal rates of the second metal 10, the seed layer 12, and the intermetallic compound 6 than a removal rate of the insulating layer 3. Therefore, the insulating layer 3 functions as a polishing stopper.

Figure 8C:
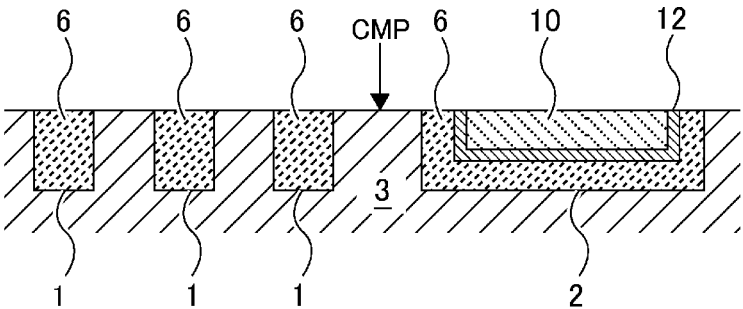
FIG. 8C is a diagram further illustrating the embodiment shown in FIGS. 7A to 7D.

As shown in FIG. 8C, after the second planarization process, a height adjustment process is performed. This height adjustment process is a process of polishing the second metal 10, the seed layer 12, the intermetallic compound 6, and the insulating layer 3 until a height of the intermetallic compound 6 in the first interconnect trenches 1 reaches a predetermined height. More specifically, the second metal 10, the seed layer 12, the intermetallic compound 6, and the insulating layer 3 are placed in sliding contact with a third polishing pad while a third polishing liquid is supplied onto the third polishing pad. The second metal 10, the seed layer 12, the intermetallic compound 6, and the insulating layer 3 are polished by a chemical action of the third polishing liquid and a mechanical action of abrasive grains contained in the third polishing liquid and/or the third polishing pad.

The height adjustment process uses the third polishing liquid having a removal-rate selectivity that achieves removal rates of the second metal 10, the seed layer 12, and the intermetallic compound 6 which are the same as or lower than a removal rate of the insulating layer 3. Specifically, if dishing is expected to occur when the second metal 10, the seed layer 12, and the intermetallic compound 6 in the second interconnect trench 2 are polished, the third polishing liquid having a removal-rate selectivity that achieves removal rates of the second metal 10, the seed layer 12, and the intermetallic compound 6 which are lower than a removal rate of the insulating layer 3 is used. On the other hand, if it is expected that dishing will not occur when the second metal 10, the seed layer 12, and the intermetallic compound 6 in the second interconnect trench 2 are polished, the third polishing liquid having a removal-rate selectivity that achieves removal rates of the second metal 10, the seed layer 12, and the intermetallic compound 6 which are the same as a removal rate of the insulating layer 3 is used.

According to each of the above-described embodiments, the interconnects in the narrow first interconnect trenches 1 are composed only of the intermetallic compound 6. Therefore, a barrier-metal-free metal interconnect structure can be realized.

FIG. 9 is a schematic diagram showing a manufacturing system for manufacturing the barrier-metal-free metal interconnect structure described above. The manufacturing system includes a sputtering device 20 for forming the intermetallic compound 6, a plating device 22 for forming the second metal 10, a film-forming device 23 for forming the seed layer 12, a plurality of CMP devices (chemical mechanical polishing devices) 24, 25, 26, a cleaning device 31 for cleaning a polished workpiece, a drying device 33 for drying the cleaned workpiece, and a transporting device 35 for transporting the workpiece. The metal interconnect structure is formed on the workpiece, such as wafer, substrate, panel, or the like.

Configurations of the manufacturing system shown in FIG. 9 are an example and can be changed as appropriate based on the metal interconnect structure to be manufactured. For example, in the embodiments described with reference to FIGS. 1A to 1D, the second metal 10 and seed layer 12 may not be formed. In such a case, the plating device 22 and film-forming device 23 may be omitted. The manufacturing system shown in FIG. 9 includes three CMP devices 24, 25, and 26, but may include only two CMP devices 24 and 25 in the case where only two types of polishing liquids are used.

Figure 10:
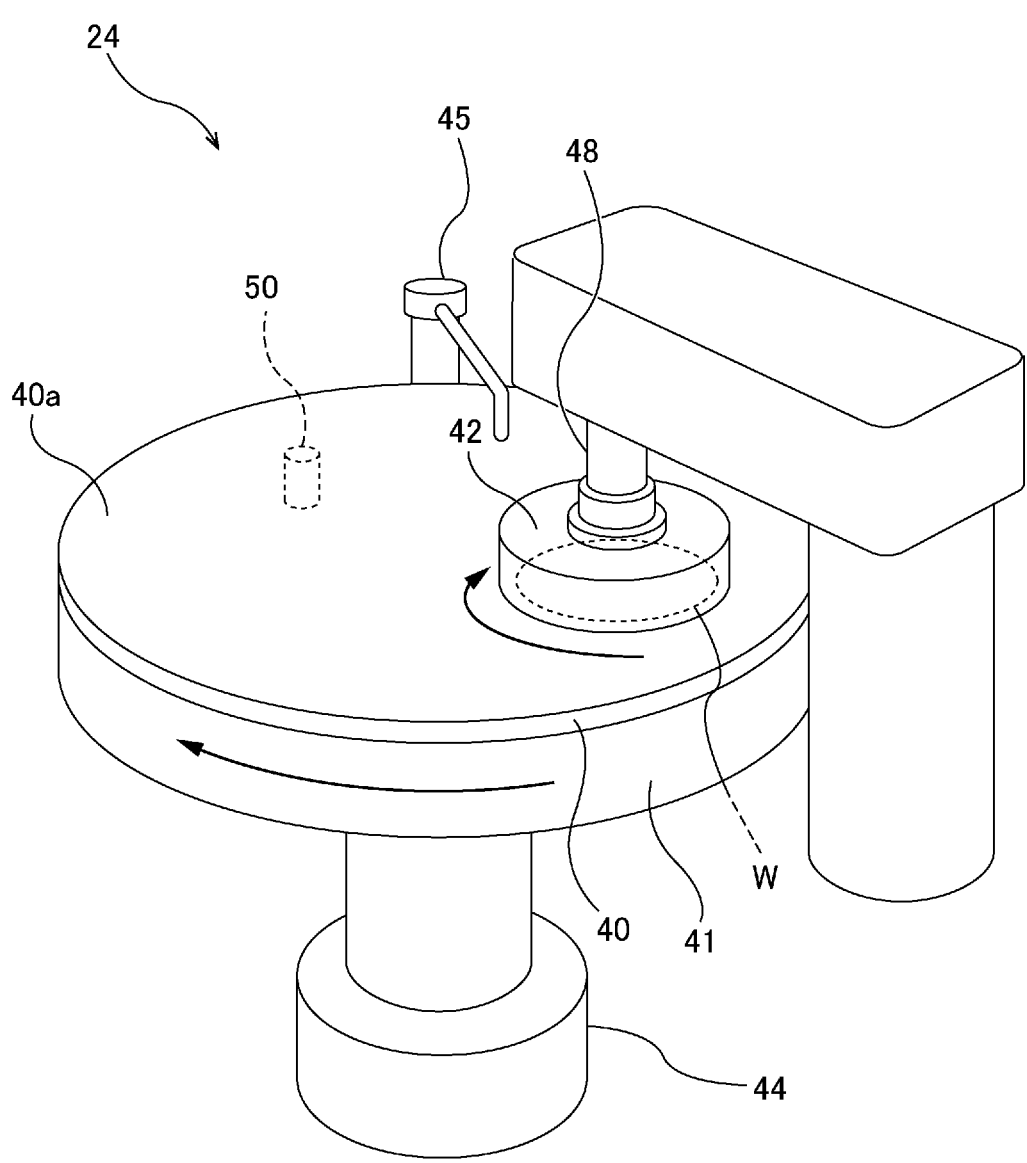
FIG. 10 is a perspective view schematically showing a first CMP device shown in FIG. 9.
Figure 11A:
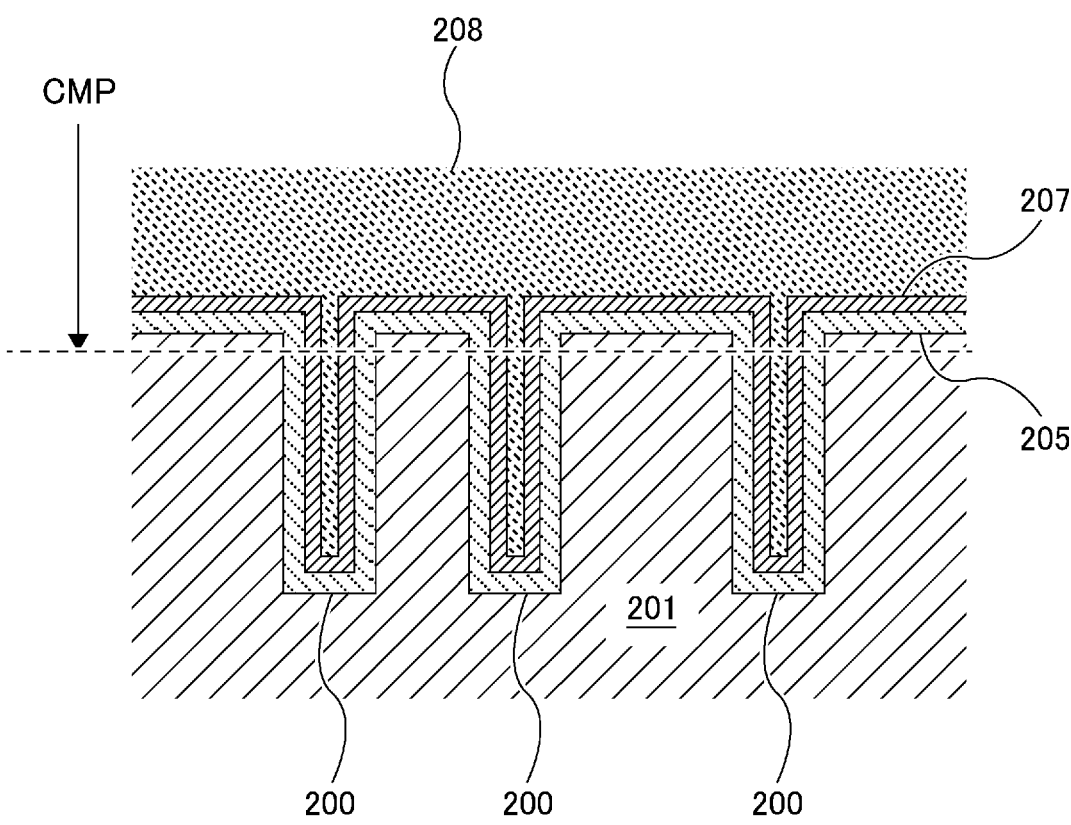
FIG. 11A is a cross-sectional view showing an example of a conventional interconnect structure.
Figure 11B:
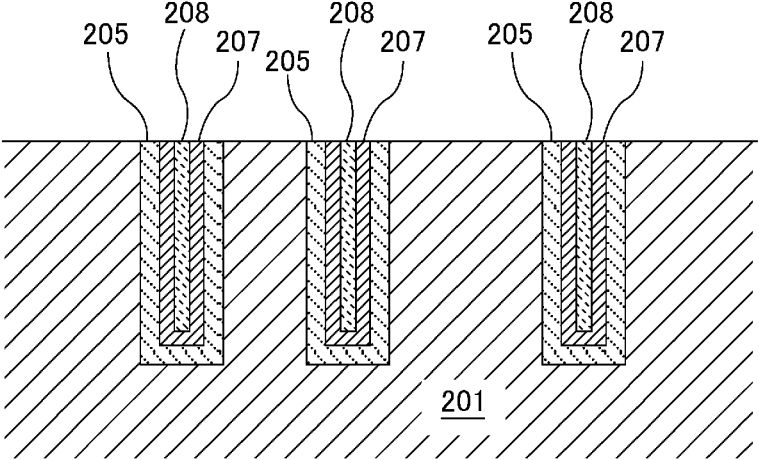
FIG. 11B is a cross-sectional view showing the example of the conventional interconnect structure.
Figure 12A:
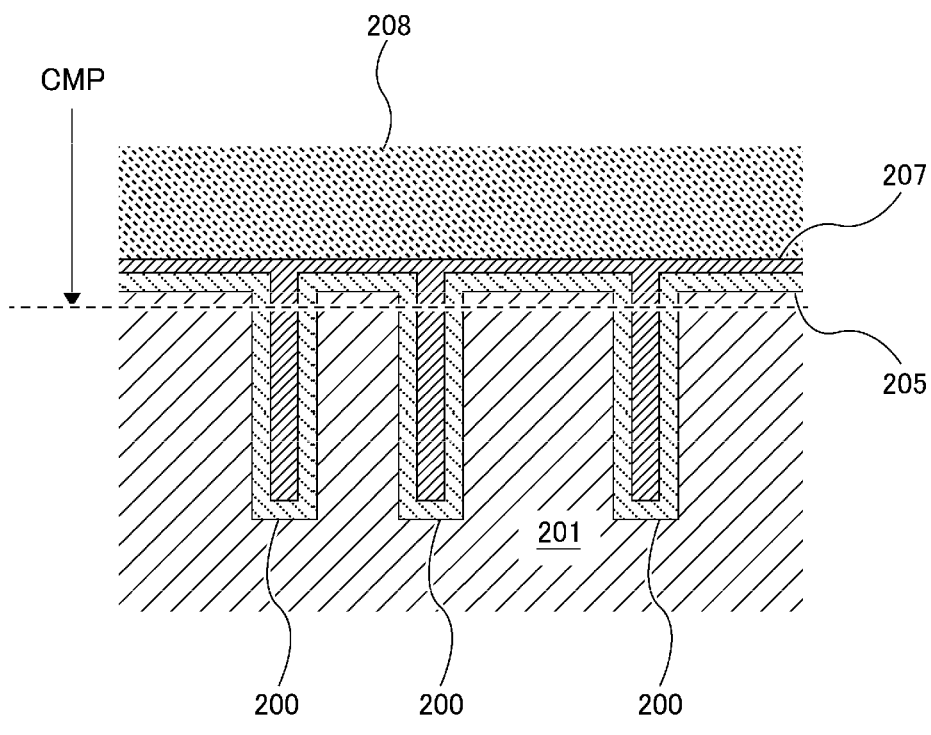
FIG. 12A is a cross-sectional view showing another example of a conventional interconnect structure.
Figure 12B:
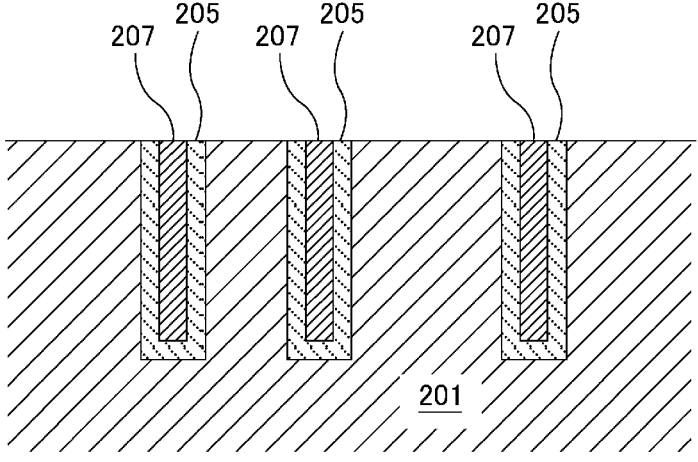
FIG. 12B is a sectional view showing another example of the conventional interconnect structure.

The first CMP device 24, the second CMP device 25, and the third CMP device 26 basically have the same configuration. Accordingly, the first CMP device 24 will be described below with reference to FIG. 10. As shown in FIG. 10, the first CMP device 24 includes a first polishing table 41 that supports a first polishing pad 40, a first polishing head 42 for pressing a workpiece W against the first polishing pad 40, a first table motor 44 for rotating the first polishing table 41, and a first polishing-liquid supply nozzle 45 for supplying a first polishing liquid onto the first polishing pad 40. An upper surface of the first polishing pad 40 provides a polishing surface 40a for polishing the workpiece W.

The first polishing head 42 is coupled to a head shaft 48, and the head shaft 48 is coupled to a first polishing-head motor (not shown). The first polishing-head motor rotates the first polishing head 42 together with the head shaft 48 in a direction indicated by arrow. The first polishing table 41 is coupled to the first table motor 44, and the first table motor 44 is configured to rotate the first polishing table 41 and the first polishing pad 40 in a direction indicated by arrow.

The workpiece W is polished as follows. While the first polishing table 41 and the first polishing head 42 are rotated in the directions indicated by the arrows in FIG. 10, the first polishing liquid is supplied from the first polishing-liquid supply nozzle 45 onto the polishing surface 40a of the first polishing pad 40. The workpiece W is pressed against the polishing surface 40a by the first polishing head 42 in the presence of the first polishing liquid on the first polishing pad 40, while the workpiece W is rotated by the first polishing head 42. The metal interconnect structure formed on the workpiece W is polished by a chemical action of the first polishing liquid and a mechanical action of abrasive grains contained in the first polishing liquid and/or the first polishing pad 40.

The first CMP device 24 includes a first film-thickness sensor 50 for measuring a film thickness of the metal interconnect structure formed on the workpiece W. Although configurations of the first film-thickness sensor 50 are not particularly limited, an eddy current sensor is used in this embodiment. The first film-thickness sensor 50 is attached to the first polishing table 41 and rotates together with the first polishing table 41 and the first polishing pad 40. A position of the first film-thickness sensor 50 is such that the first film-thickness sensor 50 moves across the surface of the workpiece W on the first polishing pad 40 each time the first polishing table 41 and the first polishing pad 40 make one revolution. The thickness of the intermetallic compound 6 formed on the workpiece W is measured by the first film-thickness sensor 50.

Although not shown in the drawings, the second CMP device 25 includes a second polishing table that supports a second polishing pad, a second polishing head for pressing the workpiece W against the second polishing pad, and a second table motor for rotating the second polishing table, a second polishing-liquid supply nozzle for supplying a second polishing liquid onto the second polishing pad, and a second film-thickness sensor for measuring the film thickness of the workpiece W. Similarly, the third CMP device 26 includes a third polishing table that supports a third polishing pad, a third polishing head for pressing the workpiece W against the third polishing pad, and a third table motor for rotating the third polishing table, a third polishing-liquid supply nozzle for supplying a third polishing liquid onto the third polishing pad, and a third film-thickness sensor for measuring the film thickness of the workpiece W. The third CMP device 26 may not be provided.

The cleaning device 31 is configured to clean the workpiece W that has been polished by the CMP devices 24, 25, and 26. In this embodiment, the cleaning device 31 is a roll cleaning device configured to scrub both surfaces of the workpiece W with roll scrubbers while supplying cleaning liquid to the workpiece W. In one embodiment, the cleaning device 31 may be a pen sponge cleaning device configured to scrub one surface of the workpiece W with a pen sponge while supplying cleaning liquid to the workpiece W.

The drying device 33 is configured to dry the workpiece W that has been cleaned by the cleaning device 31. In this embodiment, the drying device 33 is an IPA drying device configured to supply isopropyl alcohol to the workpiece W while rotating the workpiece W. In one embodiment, the drying device 33 may be a spin-drying device configured to rotate the workpiece W at high speed.

The transporting device 35 is configured to transport the workpiece between the CMP devices 24, 25, 26, the cleaning device 31, and the drying device 33.

The film-forming device 23 for forming the seed layer 12 may be a sputtering device, an electroless plating device, a PVD device, a CVD device, or the like. In the case where a metal interconnect structure without the seed layer 12 is manufactured, the film-forming device 23 may be omitted.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a metal interconnect structure for a semiconductor device, etc. and a manufacturing method thereof, and more particularly applicable to a metal interconnect structure that does not contain a barrier metal and a manufacturing method of such metal interconnect structure.

REFERENCE SIGNS LIST 1 first interconnect trench
2 second interconnect trench
3 insulating layer
6 intermetallic compound
10 second metal
12 seed layer
20 sputtering device
22 plating device
23 film-forming device
24,25,26 CMP device (chemical mechanical polishing device)
31 cleaning device
33 drying device
35 transporting device
40 first polishing pad
41 first polishing table
42 first polishing head
44 first table motor
45 first polishing-liquid supply nozzle
48 head shaft
50 first film-thickness sensor

The invention claimed is:

1. A method of manufacturing a barrier-metal-free metal interconnect structure, comprising:
   filling at least a first interconnect trench with an intermetallic compound by depositing the intermetallic compound on an insulating layer having the first interconnect trench and a second interconnect trench formed in the insulating layer, the second interconnect trench being wider than the first interconnect trench;
   performing a planarization process of polishing the intermetallic compound until the insulating layer is exposed;
   performing a height adjustment process of polishing the intermetallic compound and the insulating layer until a height of the intermetallic compound in the first interconnect trench reaches a predetermined height; and
   depositing a second metal on the intermetallic compound to fill the second interconnect trench with the second metal after the first interconnect trench is filled with the intermetallic compound, the second metal being different from the intermetallic compound, wherein the planarization process is a process of polishing the second metal and the intermetallic compound until the insulating layer is exposed, and
      the height adjustment process is a process of polishing the second metal, the intermetallic compound, and the insulating layer until the height of the intermetallic compound in the first interconnect trench reaches the predetermined height.

2. The method according to claim 1, wherein the planarization process is performed using a first polishing liquid having a removal-rate selectivity that achieves higher removal rates of the second metal and the intermetallic compound than a removal rate of the insulating layer, and
   the height adjustment process is performed using a second polishing liquid having a removal-rate selectivity that achieves removal rates of the second metal and the intermetallic compound which are the same as or lower than a removal rate of the insulating layer.

3. The method according to claim 1, wherein the planarization process includes:
   a first planarization process of polishing the second metal until the intermetallic compound is exposed; and
   a second planarization process of polishing the second metal and the intermetallic compound until the insulating layer is exposed.

4. The method according to claim 3, wherein the first planarization process is performed using a first polishing liquid having a removal-rate selectivity that achieves a higher removal rate of the second metal than a removal rate of the intermetallic compound,
   the second planarization process is performed using a second polishing liquid having a removal-rate selectivity that achieves higher removal rates of the second metal and the intermetallic compound than a removal rate of the insulating layer, and
   the height adjustment process is performed using a third polishing liquid having a removal-rate selectivity that achieves removal rates of the second metal and the intermetallic compound which are the same as or lower than a removal rate of the insulating layer.

5. A method of manufacturing a barrier-metal-free metal interconnect structure, comprising:
   filling at least a first interconnect trench with an intermetallic compound by depositing the intermetallic compound on an insulating layer having the first interconnect trench and a second interconnect trench formed in the insulating layer, the second interconnect trench being wider than the first interconnect trench;
   performing a planarization process of polishing the intermetallic compound until the insulation layer is exposed;
   performing a height adjustment process of polishing the intermetallic compound and the insulating layer until a height of the intermetallic compound in the first interconnect trench reaches a predetermined height;
   forming a seed layer on the intermetallic compound after the first interconnect trench is filled with the intermetallic compound; and
   depositing a second metal on the seed layer to fill the second interconnect trench with the second metal, the second metal being different from the intermetallic compound, wherein the planarization process is a process of polishing the second metal, the seed layer, and the intermetallic compound until the insulating layer is exposed, and
      the height adjustment process is a process of polishing the second metal, the seed layer, the intermetallic compound, and the insulating layer until the height of the intermetallic compound in the first interconnect trench reaches the predetermined height.

6. A method of manufacturing a barrier-metal-free metal interconnect structure, comprising:
   filling at least a first interconnect trench with an intermetallic compound by depositing the intermetallic compound on an insulating layer having the first interconnect trench and a second interconnect trench formed in the insulating layer, the second interconnect trench being wider than the first interconnect trench;

performing a planarization process of polishing the intermetallic compound until the insulating layer is exposed;

performing a height adjustment process of polishing the intermetallic compound and the insulating layer until a height of the intermetallic compound in the first interconnect trench reaches a predetermined height;

forming a seed layer on the intermetallic compound after the first interconnect trench is filled with the intermetallic compound; and depositing a second metal on the seed layer to fill the second interconnect trench with the second metal, the second metal being different from the intermetallic compound, wherein the planarization process is performed using a first polishing liquid having a removal-rate selectivity that achieves higher removal rates of the second metal, the seed layer, and the intermetallic compound than a removal rate of the insulating layer, and the height adjustment process is performed using a second polishing liquid having a removal-rate selectivity that achieves removal rates of the second metal, the seed layer, and the intermetallic compound which are the same as or lower than a removal rate of the insulating layer.

7. A method of manufacturing a barrier metal-free metal interconnect structure, comprising:

filling at least a first interconnect trench with an intermetallic compound by depositing the intermetallic compound on an insulating layer having the first interconnect trench and a second interconnect trench formed in the isolating layer, the second interconnect trench being wider than the first interconnect trench;

performing a planarization process of polishing the intermetallic compound until the insulating layer is exposed;

performing a height adjustment process of polishing the intermetallic compound and the insulating layer until a height of the intermetallic compound in the first interconnect trench reaches a predetermined height;

forming a seed layer on the intermetallic compound after the first interconnect trench is filled with the intermetallic compound; and depositing a second metal on the seed layer to fill the second interconnect trench with the second metal, the second metal being different from the intermetallic compound, wherein the planarization process includes:

a first planarization process of polishing the second metal and the seed layer until the intermetallic compound is exposed; and a second planarization process of polishing the second metal, the seed layer, and the intermetallic compound until the insulating layer is exposed.

8. The method according to claim 7, wherein the first planarization process is performed using a first polishing liquid having a removal-rate selectivity that achieves higher removal rates of the second metal and the seed layer than a removal rate of the intermetallic compound, the second planarization process is performed using a second polishing liquid having a removal-rate selectivity that achieves higher removal rates of the second metal, the seed layer, and the intermetallic compound than a removal rate of the insulating layer, and the height adjustment process is performed using a third polishing liquid having a removal-rate selectivity that achieves removal rates of the second metal, the seed layer, and the intermetallic compound which are the same as or lower than a removal rate of the insulating layer.

9. The method according to claim 1, wherein the intermetallic compound is $CuAl_2$ or NiAl.

* * * * *